United States Patent
Aoyama et al.

(10) Patent No.: US 8,828,853 B2
(45) Date of Patent: Sep. 9, 2014

(54) SEMICONDUCTOR DEVICE AND METHOD OF MANUFACTURING THE SAME

(75) Inventors: Tomonori Aoyama, Yokohama (JP); Kiyotaka Miyano, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/415,232

(22) Filed: Mar. 8, 2012

(65) Prior Publication Data
US 2012/0273790 A1    Nov. 1, 2012

(30) Foreign Application Priority Data
Apr. 28, 2011    (JP) .................................. 2011-100498

(51) Int. Cl.
*H01L 21/20*    (2006.01)
(52) U.S. Cl.
USPC ............. 438/487; 438/486; 438/630; 257/66; 257/324; 257/E29.309
(58) Field of Classification Search
None
See application file for complete search history.

(56) References Cited

U.S. PATENT DOCUMENTS

| | | | | |
|---|---|---|---|---|
| 6,133,076 | A  * | 10/2000 | Yamazaki et al. | 438/166 |
| 2007/0105352 | A1* | 5/2007 | Gu et al. | 438/487 |
| 2009/0194821 | A1* | 8/2009 | Kaneko et al. | 257/377 |
| 2010/0213538 | A1* | 8/2010 | Fukuzumi et al. | 257/326 |
| 2010/0224870 | A1* | 9/2010 | Iwasaki et al. | 257/43 |
| 2011/0111580 | A1  | 5/2011 | Aoyama et al. | |
| 2011/0215333 | A1  | 9/2011 | Aoyama et al. | |
| 2012/0025200 | A1  | 2/2012 | Aoyama et al. | |

FOREIGN PATENT DOCUMENTS

JP    H7-335545    *    6/1995    ............ H01L 21/20

OTHER PUBLICATIONS

Lee et al., Low-Temperature Crystallization of Amorphous Silicon Thin Films by Microwave Heating, Mat. Res. Soc. Symp. Proc., Materials Research Society, vol. 471 (1997), pp. 173-178.*
Machine translation, Sano, JP H7-335545, translation date: Aug. 5, 2013, JPO & Japio, all pages.*
Lee et al., Low-Temperature Crystallization of Amorphous Silicon Thin Films by Microwave Heating, Mat. Res. Soc. Symp. Proc., vol. 471, Materials Research Society (1997), pp. 173-178.*
Subramanian, V. et al., "High-Performance Germanium-Seeded Laterally Crystallized TFT's for Vertical Device Integration," IEEE Transaction on Electron Device, vol. 45, No. 9, pp. 1934-1939 (1998).
Subramanian, V. et al., "A Novel Technique for 3-D Integration: Ge-seeded Laterally Crystallized TFT's," 1997 symposium on VLSI Technology Digest of Technical Papers, pp. 97-98 (1997).
Katsumata, R. et al., "Pipe-shaped BiCS Flash Memory with 16 Stacked Layers and Multi-Level-Cell Operation for Ultra High Density Storage Devices," 2009 Symposium on VLSI Technology Digest of Technical Papers, pp. 136-137, (2009).

* cited by examiner

*Primary Examiner* — Fernando L Toledo
*Assistant Examiner* — Victoria K Hall
(74) *Attorney, Agent, or Firm* — Finnegan, Henderson, Farabow, Garrett & Dunner, L.L.P.

(57) ABSTRACT

In one embodiment, a method of manufacturing a semiconductor device includes forming an amorphous semiconductor film on a substrate. The method further includes annealing the amorphous semiconductor film by irradiating the substrate with a microwave to form a polycrystalline semiconductor film from the amorphous semiconductor film. The method further includes forming a transistor whose channel is the polycrystalline semiconductor film.

14 Claims, 9 Drawing Sheets

NUCLEUS GENERATION

NUCLEUS GENERATION

FIG.5C

CRYSTAL GROWTH + NUCLEUS GENERATION

FIG.5D

SMALL GRAINS

NUCLEUS GENERATION

FIG.6C

CRYSTAL GROWTH

FIG.6D

LARGE GRAINS

FIG.10D

SEMICONDUCTOR DEVICE AND METHOD OF MANUFACTURING THE SAME

CROSS REFERENCE TO RELATED APPLICATION

This application is based upon and claims the benefit of priority from the prior Japanese Patent Application No. 2011-100498, filed on Apr. 28, 2011, the entire contents of which are incorporated herein by reference.

FIELD

Embodiments described herein relate to a semiconductor device and a method of manufacturing the same.

BACKGROUND

In a three-dimensional memory of the following generations, a polycrystalline silicon (Si) thin film or a polycrystalline silicon germanium (SiGe) thin film is necessary, for example, for a channel of a bit cost scalable (BiCS) flash memory or the like. Those films are usually deposited as an amorphous Si thin film and an amorphous SiGe thin film so as to form the films in smooth morphology for excellently covering a step portion. Since the amorphous Si and SiGe thin films need to be finally changed into polycrystalline thin films to decrease the resistance, the amorphous thin films need to be crystallized by heat treatment.

In a case where the heat treatment is performed by conventional furnace annealing or lamp annealing, even if the temperature of the heat treatment is set to be high, there is caused a problem that grain diameters of a Si crystal and a SiGe crystal become small, so that the carrier mobility of a channel Si thin film and a channel SiGe thin film becomes low. In addition, since the temperature of the heat treatment is high, there is caused a problem of characteristic deterioration and the like in a peripheral transistor.

A known example of a method of forming the Si crystal having a large grain diameter by crystallizing the amorphous Si film is a method of forming the Si crystal by solid-phase growth using a Ge crystal in contact with the amorphous Si film as a nucleus. However, this method has problems that the process is complicated, the Ge nucleus is difficult to form, and it takes long time for the crystallization.

BRIEF DESCRIPTION OF THE DRAWINGS

FIGS. 2A to 4B are side sectional views showing a method of manufacturing the semiconductor device of the first embodiment;

DETAILED DESCRIPTION

Embodiments will now be explained with reference to the accompanying drawings.

An embodiment described herein is a method of manufacturing a semiconductor device, the method including forming an amorphous semiconductor film on a substrate. The method further includes annealing the amorphous semiconductor film by irradiating the substrate with a microwave to form a polycrystalline semiconductor film from the amorphous semiconductor film. The method further includes forming a transistor whose channel is the polycrystalline semiconductor film.

First Embodiment

Figure 1:
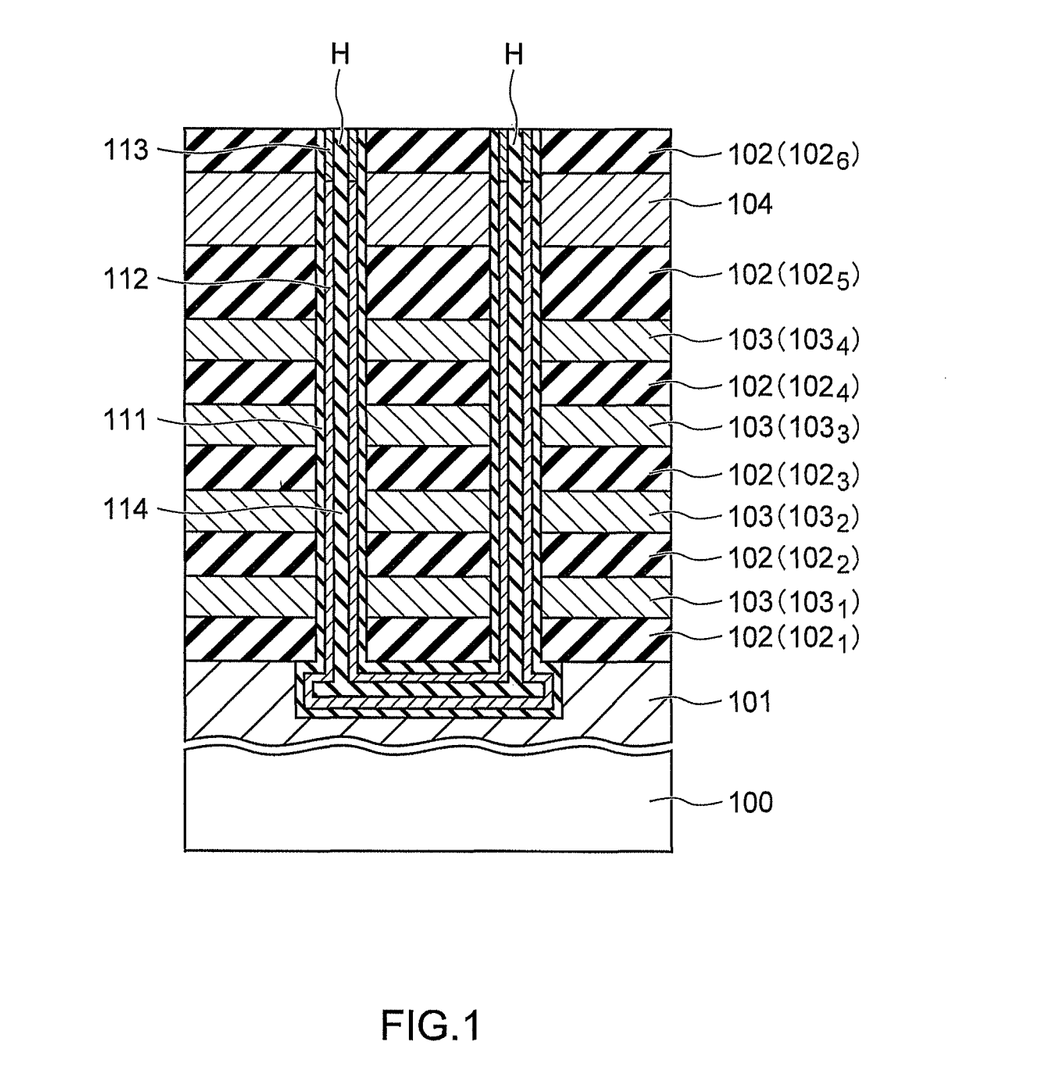
FIG. 1 is a side sectional view showing a structure of a semiconductor device of a first embodiment.

FIG. 1 is a side sectional view showing a structure of a semiconductor device of a first embodiment. The device of FIG. 1 is a BiCS flash memory.

The device of FIG. 1 includes a semiconductor substrate 100 and an electrode film 101. For example, the semiconductor substrate 100 is a Si substrate, and the electrode film 101 is a Si film. The electrode film 101 is formed on the semiconductor substrate 100 via an insulator (not shown). Although the electrode film 101 is provided separately from the semiconductor substrate 100 in the present embodiment, a structure in which a part of the semiconductor substrate 100 is used as an electrode may be adopted.

Insulating films 102 and semiconductor films 103 are alternately stacked on the electrode film 101. For example, the insulating films 102 are silicon oxide ($SiO_2$) films, and the semiconductor films 103 are Si films. The semiconductor films 103 function as word lines of the BiCS flash memory. As an example, FIG. 1 shows a structure in which five insulating films $102_1$ to $102_5$ and four semiconductor films $103_1$ to $103_4$ are alternately stacked on the electrode film 101.

A semiconductor film 104 thicker than a semiconductor film 103 is stacked on the insulating film $102_5$. For example, the semiconductor film 104 is a Si film. The semiconductor film 104 functions as a select gate of the BiCS flash memory. An insulating film $102_6$ is stacked on the semiconductor film 104. For example, the insulating film $102_6$ is a $SiO_2$ film.

A memory hole H having a pipe shape is opened in the structure in which the electrode film 101, the insulating films 102, the semiconductor films 103, and the semiconductor film 104 are stacked. The memory hole H includes two holes penetrating the insulating films 102, the semiconductor films 103, and the semiconductor film 104 and one hole formed in the electrode film 101 and connecting the two holes.

A memory insulating film 111 and a polycrystalline Si film 112 are successively formed on the inner wall surface of the memory hole H. For example, the memory insulating film 111 is a single-layer film such as a silicon oxide ($SiO_2$) film, a silicon nitride (SiN) film, or an alumina ($Al_2O_3$) film, or a multilayer-film including at least one of those films. Total thickness of the memory insulating film 111 and the polycrystalline Si film 112 is preferably set so that the memory hole H is not closed.

In the BiCS flash memory of FIG. 1, the semiconductor films 103, the memory insulating film 111, and the polycrystalline Si film 112 form memory cell transistors. Furthermore, the semiconductor film 104, the memory insulating film 111, and the polycrystalline Si film 112 form select gate transistors. The polycrystalline Si film 112 functions as channel of those transistors. The polycrystalline Si film 112 is an example of a polycrystalline semiconductor film of the disclosure.

The device of FIG. 1 further includes doped polycrystalline Si regions 113 and a buried insulator 114. The doped polycrystalline Si regions 113 are formed in part of the polycrystalline Si film 112, specifically, in positions surrounded by the semiconductor film 104. The buried insulator 114 is buried in the memory hole H in which the memory insulating film 111, the polycrystalline Si film 112, and the doped polycrystalline Si regions 113 are formed. For example, the buried insulator 114 is a SiN film. In the case where the memory hole H is closed with the memory insulating film 111, the polycrystalline Si film 112, and the doped polycrystalline Si regions 113, the buried insulator 114 is unnecessary.

In the present embodiment, the doped polycrystalline Si regions 113 in the polycrystalline Si film 112 are formed of extrinsic semiconductor, and the region other than the doped polycrystalline Si regions 113 is formed of intrinsic semiconductor.

(1) Method of Manufacturing Semiconductor Device

A method of manufacturing the semiconductor device of FIG. 1 will now be described with reference to FIGS. 2A to 4B.

FIGS. 2A to 4B are side sectional views showing the method of manufacturing the semiconductor device of the first embodiment.

Figure 2A:
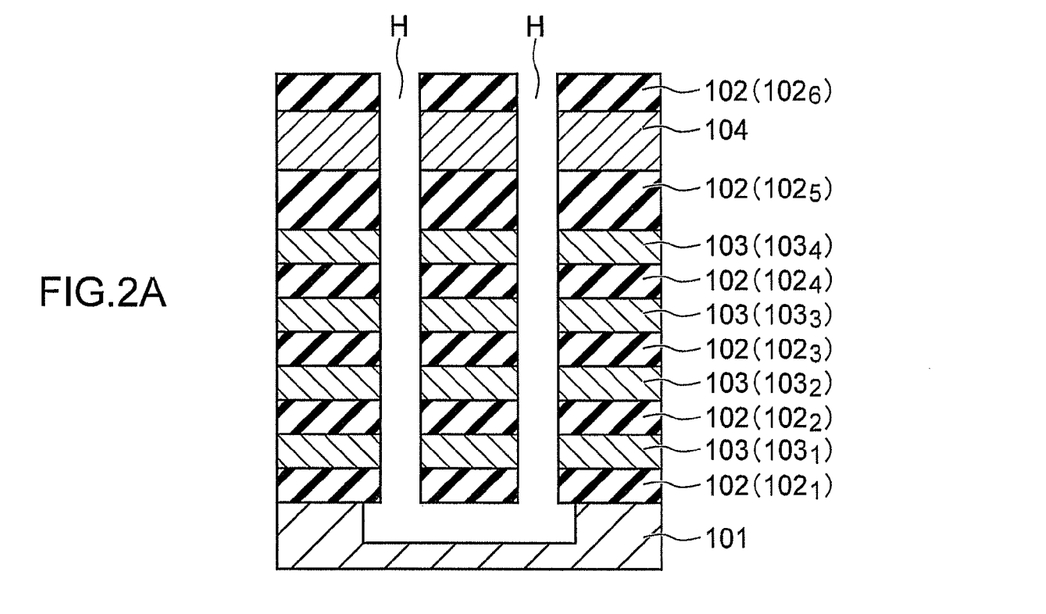

First, as shown in FIG. 2A, the structure in which the memory hole H is opened in the electrode film 101, the insulating films 102, the semiconductor films 103, and the semiconductor film 104 is formed. The electrode film 101, the insulating films 102, the semiconductor films 103, and the semiconductor film 104 are stacked on the semiconductor substrate 100 of FIG. 1.

Figure 2B:
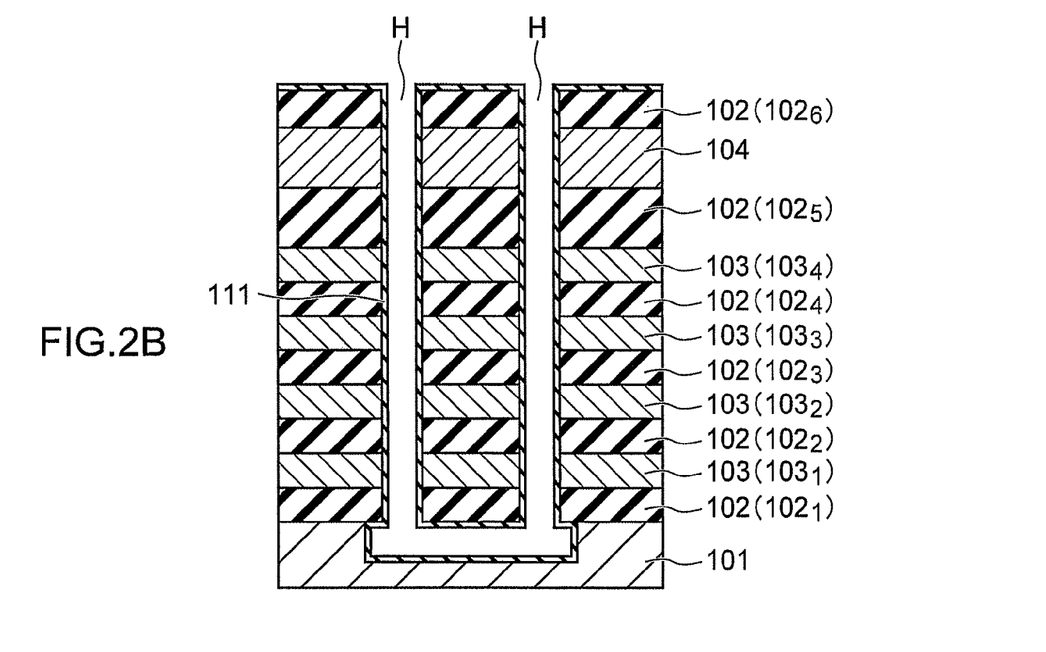

Next, as shown in FIG. 2B, the memory insulating film 111 is formed on the entire surface of the semiconductor substrate 100 (not shown). As a result, the memory insulating film 111 is formed on the inner wall surface of the memory hole H.

Figure 3A:
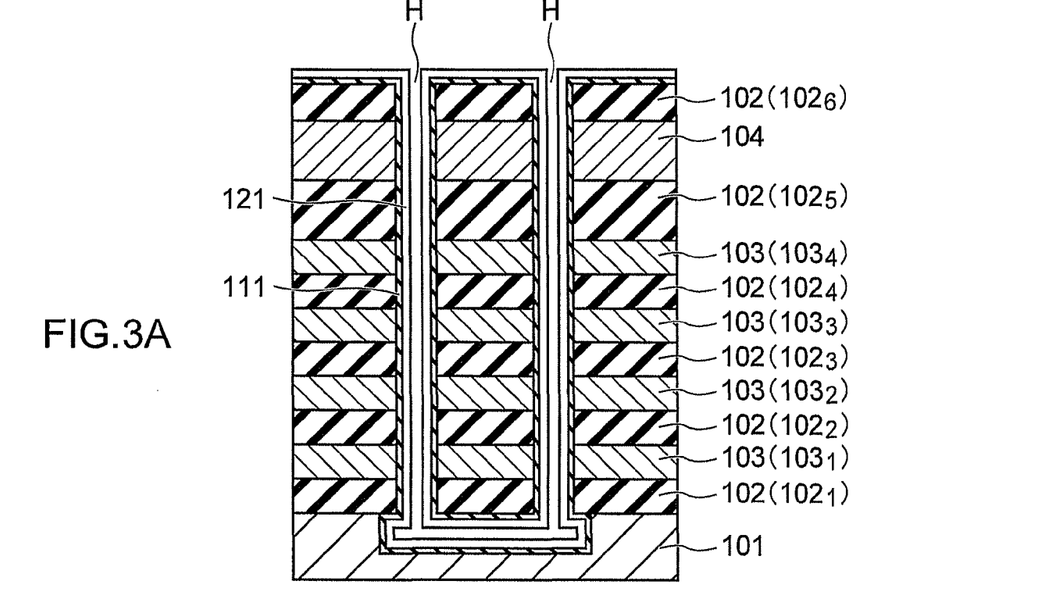

Then, as shown in FIG. 3A, an amorphous Si film 121 having a thickness of 4 to 10 nm is deposited on the entire surface of the semiconductor substrate 100 (not shown) using a $SiH_4$ gas and/or a $Si_2H_6$ gas. As a result, the amorphous Si film 121 is formed on the inner wall surface of the memory hole H via the memory insulating film 111. The amorphous Si film 121 is an example of an amorphous semiconductor film of the disclosure.

Figure 3B:
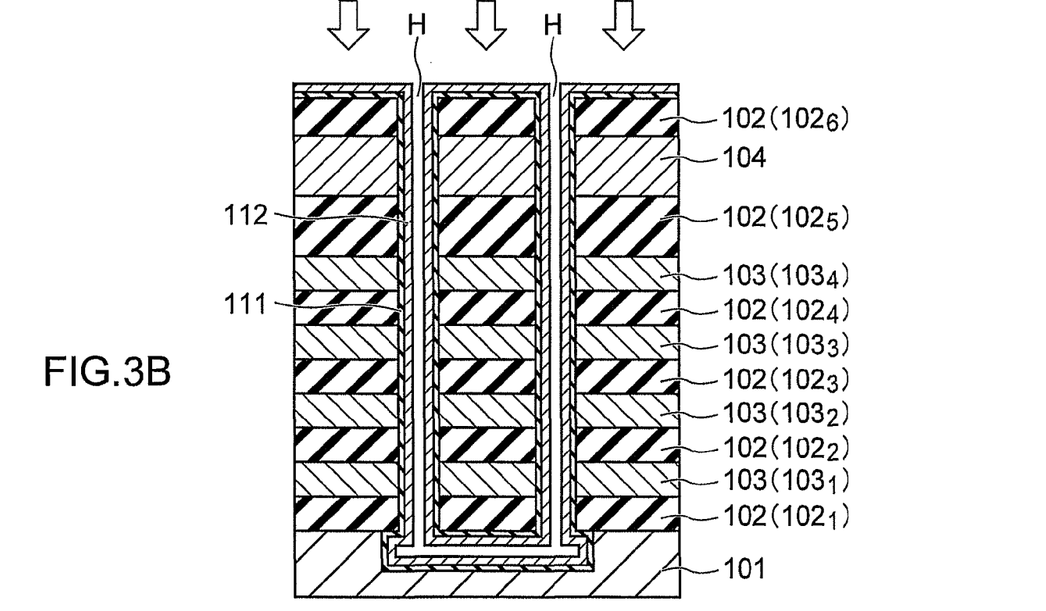

Next, as shown in FIG. 3B, the amorphous Si film 121 on the semiconductor substrate 100 is annealed by irradiating the semiconductor substrate 100 with a microwave. In the present embodiment, the semiconductor substrate 100 is irradiated with the microwave of 5.80 GHz at power of 10 $W/cm^2$ to 10 $kW/cm^2$. The substrate temperature is increased into 600° C. to 800° C. by the irradiation of the microwave. At this temperature, the microwave annealing is performed for two minutes to one hour. According to the annealing, the amorphous Si film 121 is changed into the polycrystalline Si film 112.

Figure 4A:
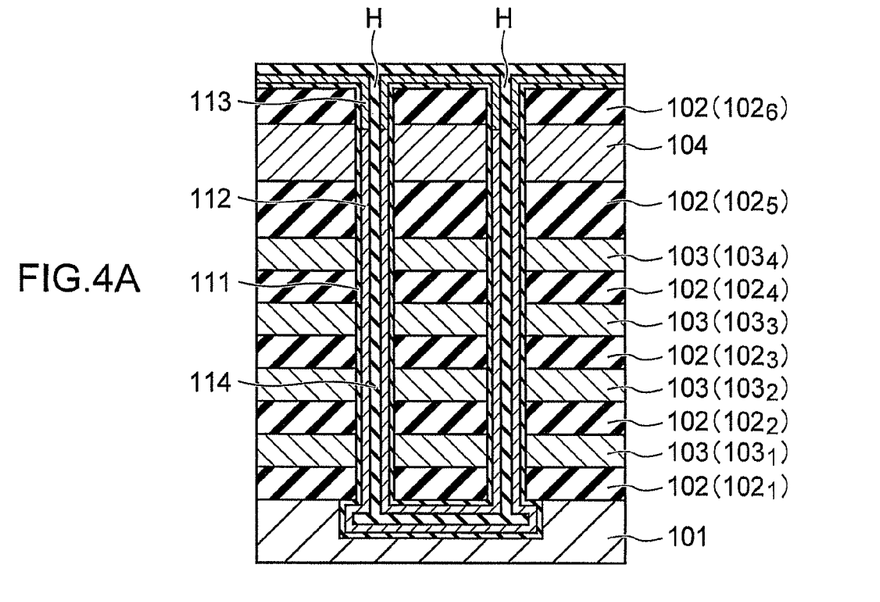

Next, as shown in FIG. 4A, upper portions of the polycrystalline Si film 112 are doped with impurity to form the doped polycrystalline Si regions 113 in the polycrystalline Si film 112. The buried insulator 114 is then deposited on the entire surface of the semiconductor substrate 100. As a result, the buried insulator 114 is formed in the memory hole H.

Figure 4B:
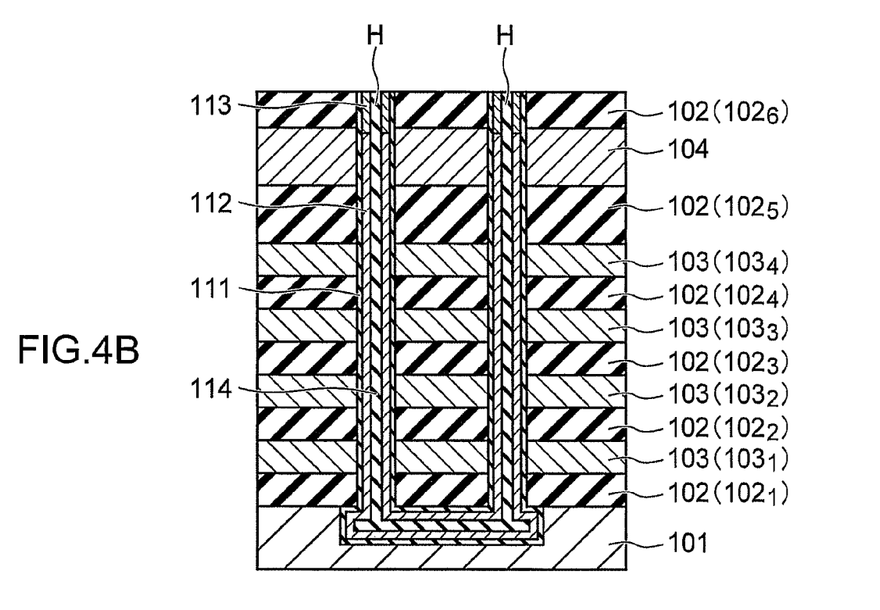

Next, as shown in FIG. 4B, the buried insulator 114, the polycrystalline Si film 112, and the memory insulating film 111 are recessed by reactive ion etching (RIE). In this way, the memory transistors and the select gate transistors whose channels are the polycrystalline Si film 112 are formed.

Various interconnect layers, plug layers, inter layer dielectrics and the like are then formed. In this way, the semiconductor device of FIG. 1 is manufactured.

(2) Comparison between Furnace Annealing and Microwave Annealing

As described above, the polycrystalline Si film 112 is formed from the amorphous Si film 121 by the microwave annealing in the present embodiment. The furnace annealing (infrared annealing) and the microwave annealing will now be compared with reference to FIGS. 5A to 7.

FIGS. 5A to 5D are diagrams showing a mechanism of crystallization in the furnace annealing.

Figure 5A:
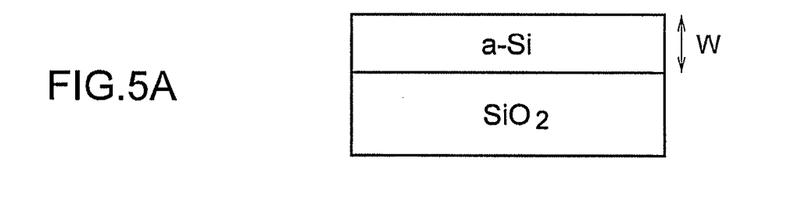
FIGS. 5A to 5D are diagrams showing a mechanism of crystallization in furnace annealing.
Figure 5B:
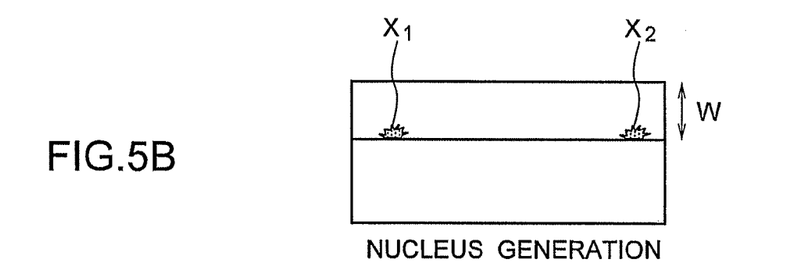
Figure 5C:
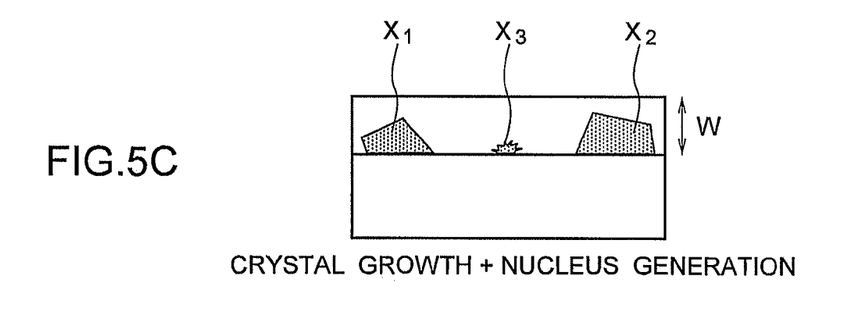

FIG. 5A shows an amorphous Si film formed on a $SiO_2$ film. When the furnace annealing on the amorphous Si film is started, as shown in FIG. 5B, nuclei $X_1$ and $X_2$ of Si crystals are generated in the amorphous Si film. When the furnace annealing is continued, as shown in FIG. 5C, the crystal nuclei $X_1$ and $X_2$ grow.

Figure 5D:
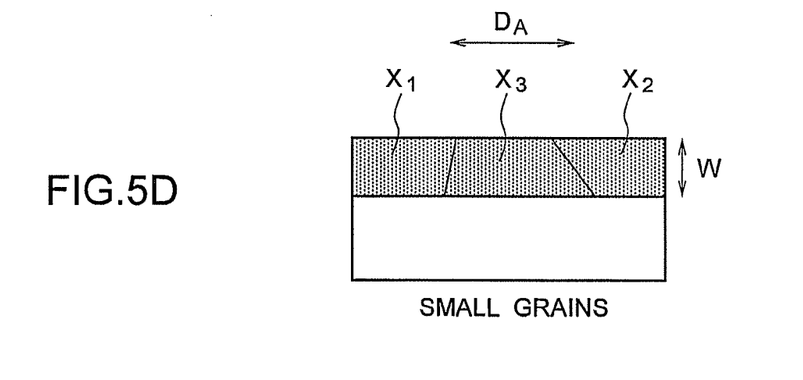

The crystallization by the furnace annealing is characterized by a low crystallization growth rate. Therefore, as shown in FIG. 5C, the frequency that a new crystal nucleus $X_3$ is generated is high during the growth of the crystal nuclei $X_1$ and $X_2$ which are generated at the beginning. Therefore, the diameters of the final crystal grains $X_1$ to $X_3$ become small. In FIG. 5D, the thickness of the polycrystalline Si film is shown by W, and the diameter of the crystal grain $X_3$ is indicated by $D_A$.

FIGS. 6A to 6D are diagrams showing a mechanism of crystallization in the microwave annealing.

Figure 6A:
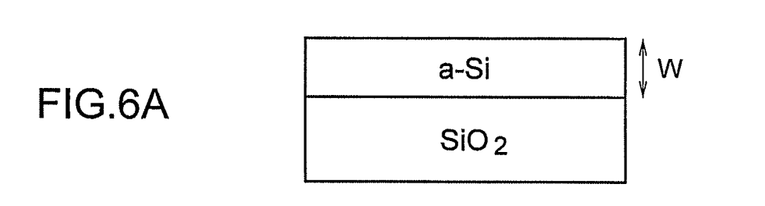
FIGS. 6A to 6D are diagrams showing a mechanism of crystallization in microwave annealing.
Figure 6B:
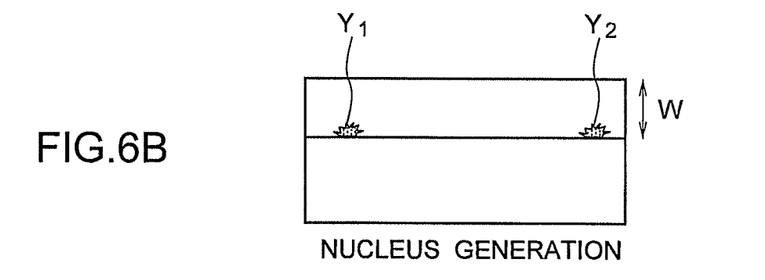
Figure 6C:
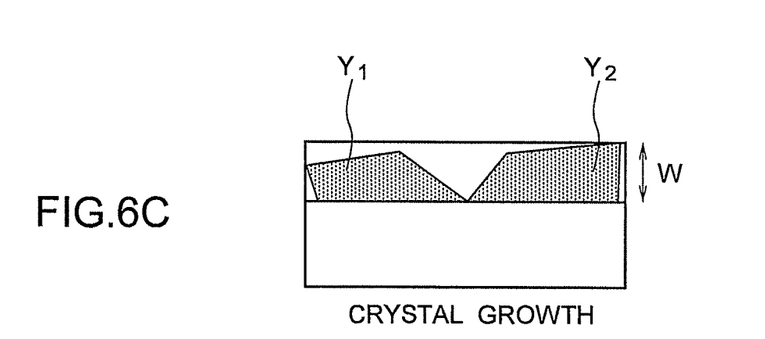

FIG. 6A shows an amorphous Si film formed on a $SiO_2$ film, similarly to FIG. 5A. When the microwave annealing on the amorphous Si film is started, as shown in FIG. 6B, nuclei $Y_1$ and $Y_2$ of Si crystals are generated in the amorphous Si film. When the microwave annealing is continued, the crystal nuclei $Y_1$ and $Y_2$ grow as shown in FIG. 6C.

Figure 6D:
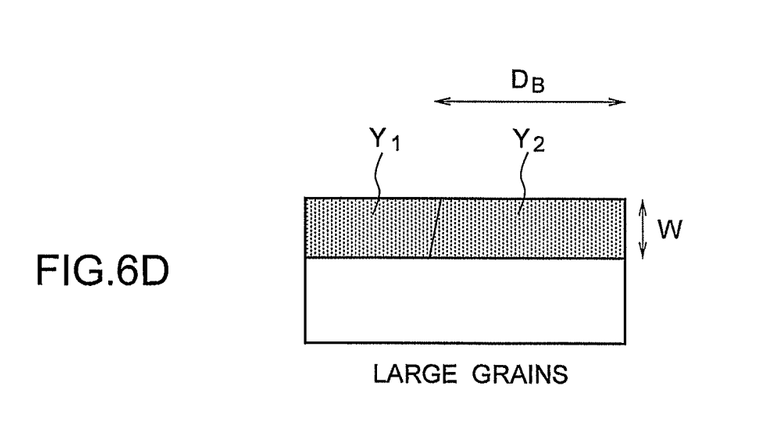

The crystallization by the microwave annealing is characterized by a higher crystallization growth rate as compared with the crystallization by the furnace annealing. Therefore, the frequency that a new crystal nucleus is generated is low during the growth of the crystal nuclei $Y_1$ and $Y_2$ which are generated at the beginning (see FIG. 6C). Therefore, the diameters of the final crystal grains $Y_1$ and $Y_2$ become large. In FIG. 6D, the thickness of the polycrystalline Si film is shown by W, and the diameter of the crystal grain $Y_2$ is indicated by $D_B$.

According to experiments by the present inventors, it was understood that even in the case where the polycrystalline Si film is an intrinsic semiconductor film, the final diameter $D_B$ of the crystal grain can be equal to or larger than twice the thickness W by the microwave annealing. On the other hand, in the case where the polycrystalline Si film is an extrinsic semiconductor film containing phosphorus, the final diameter $D_B$ of the crystal gain can be equal or larger than twice the thickness W by the infrared annealing such as the furnace annealing. However, in the case where the polycrystalline Si film is an intrinsic semiconductor film or an extrinsic semiconductor film containing impurity other than phosphorus, the final diameter $D_B$ of the crystal grain cannot be equal to or larger than twice the thickness W by the infrared annealing such as the furnace annealing. It also became clear that in the case where the polycrystalline Si film contains phosphorus of an amount at which the grain diameter $D_B$ becomes equal to or larger than twice the thickness W, the threshold voltage shifts largely, and the mobility becomes low due to impurity diffusion even if the crystal grain is large. In the present embodiment, the polycrystalline Si film 112 containing the crystal grain whose final diameter $D_B$ is equal to or larger than twice the thickness W is formed by the microwave annealing, and the polycrystalline Si film 112 containing such a crystal grain is used as a channel. This makes it possible to realize the channel having high carrier mobility, and therefore to provide a high performance semiconductor device.

Figure 7:
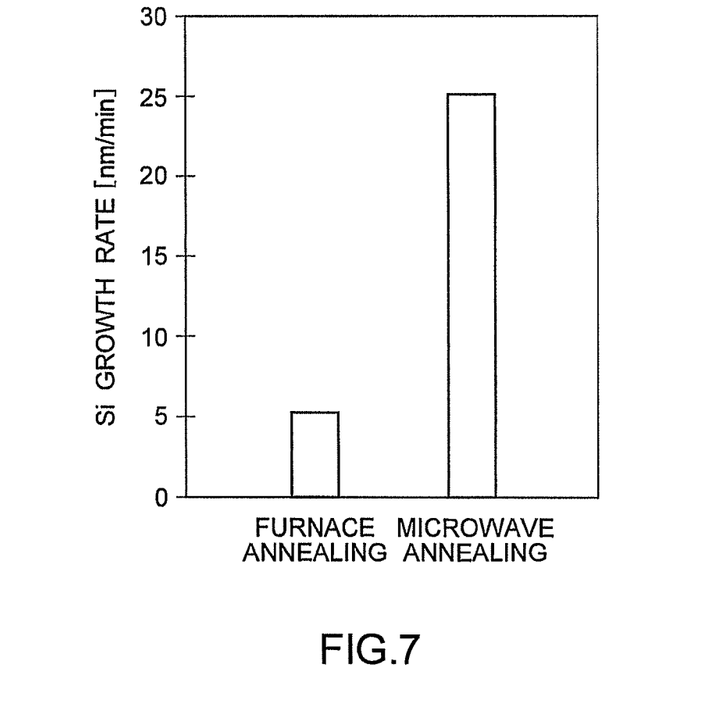
FIG. 7 is a graph showing Si Growth rates in cases where amorphous Si films are annealed by the furnace annealing and the microwave annealing using Si crystals as nuclei.

FIG. 7 is a graph showing Si growth rates (growth rates of Si crystals) in the cases where the amorphous Si films are annealed by the furnace annealing and the microwave annealing using the Si crystals as the nuclei. FIG. 7 shows the Si growth rate by the furnace annealing at 550° C., and the Si growth rate by the microwave annealing at 520° C.

As shown in FIG. 7, the crystallization growth rate in the microwave annealing is high even at a low temperature of 520° C., and is higher than that in the furnace annealing of 550° C. When the temperature is the same, it is predicted that the crystallization growth rate in the microwave annealing is higher than that in the furnace annealing by ten times or more. Therefore, according to the microwave annealing, a crystal grain having a larger diameter can be formed as compared with the furnace annealing. Similarly, according to the microwave annealing, a crystal grain having a larger diameter can be formed as compared with infrared annealing other than the furnace annealing, such as lamp annealing.

In addition, according to the microwave annealing, the crystallization of the amorphous Si film can be performed at low temperature in short time (i.e., with high throughput). Therefore, deterioration in the characteristics of a peripheral transistor and the like can be suppressed, for example.

In the case of annealing the amorphous Si film on the $SiO_2$ film, a crystal nucleus is not generated at a substrate temperature lower than 550° C. In the present embodiment, the microwave annealing is therefore performed at a substrate temperature of 550° C. or higher (specifically, 600° C. to 800° C.). The reason to set the substrate temperature to 600° C. or higher, not 550° C. or higher, is because the amorphous Si film 121 of the present embodiment is as thin as 10 nm or less. The reason of setting the substrate temperature to 800° C. or less is to suppress the problem of the deterioration in characteristics of the peripheral transistor and the like.

When the present inventors carried out the method shown in FIGS. 2 to 4, the diameters of the Si crystal grains forming the polycrystalline Si film 112 having a thickness of 10 nm were 30 nm to 250 nm. On the other hand, the diameters of the Si crystal grains obtained by the furnace annealing were about 10 nm. It was understood that the crystal grains having large diameters can be formed according to the present embodiment.

(3) Details of Microwave Annealing

Details of the microwave annealing in the present embodiment will now be described.

In the present embodiment, the microwave is introduced by using a waveguide. Therefore, a value obtained by dividing an output of a microwave oscillator such as a magnetron or a traveling-wave tube by the cross-sectional area of the waveguide is microwave irradiation power. In the case of using plural microwave oscillators, the total power of the oscillators is the microwave irradiation power.

The microwave will now be described more specifically. The microwave is specified as an electromagnetic wave having a frequency of 200 MHz to 3 THz (wavelength of 100 µm to 1 m). With respect to the frequencies of the microwave, 2.45 GHz, 5.80 GHz and 24.125 GHz are designated as internationally reserved bands of the industry-science-medical (ISM) bands. Therefore, magnetrons for generating the microwaves of those frequencies are easily obtained. Therefore, it is desirable to perform the microwave annealing of the present embodiment by using the microwave of a frequency band whose center frequency is 2.45 GHz to 25.0 GHz.

Furthermore, a dipole in amorphous Si rotates easier as the frequency in the internationally reserved bands becomes higher. However, when the frequency is too high, there is a problem that phonon oscillation in the amorphous Si is induced, and the temperature of the amorphous Si rises. Of those bands, 5.80 GHz is the frequency suitable to crystallize silicon. Therefore, in the present embodiment, 5.80 GHz is used. If the microwave in a frequency band whose center frequency is around 5.80 GHz (for example, 3 GHz to 8 GHz) is used, Si crystals having large diameters can be also obtained.

Although the Si film is used as the amorphous semiconductor film 121 in the present embodiment, a silicon germanium (SiGe) film may be used instead of the Si film. The lowest generation temperature of the crystal nucleus in the amorphous SiGe film decreases as the Ge composition ratio (the value X of $Si_{1-x}Ge_x$) increases. Therefore, in the case of using the amorphous SiGe film, the microwave annealing can be performed at substrate temperature of 600° C. or less (in the present embodiment, 550° C. or less).

For example, in the case where the Ge composition ratio is 0.7 to 0.9 and the thickness is 10 nm, the lowest generation temperature of the crystal nucleus is about 400° C. Therefore, in this case, the microwave annealing is performed at the substrate temperature of 400° C. to 550° C., for example. In this way, effects similar to those of the case of performing the microwave annealing on the amorphous Si film at the substrate temperature of 550° C. to 800° C. can be obtained. The optimum substrate temperature depends on not only the Ge composition ratio but also the thickness of the amorphous SiGe film.

In the case of using the SiGe film as the amorphous semiconductor film 121, the Ge composition ratio X may be any value satisfying the relation 0<X<1. The amorphous semiconductor film 121 may be also a Ge film.

(4) Effects of First Embodiment

Effects of the first embodiment will now be described.

As described above, in the present embodiment, the polycrystalline semiconductor film 112 is formed from the amorphous semiconductor film 121 by the microwave annealing, and a transistor whose channel is the polycrystalline semiconductor film 112 is formed. This makes it possible to crystallize the amorphous semiconductor film 121 at lower temperature and shorter time as compared with the furnace annealing and the lamp annealing. As a result, in the present embodiment, the semiconductor device can be manufactured at lower cost, and a crystal grain having a large diameter can be formed. Therefore, in the present embodiment, a channel having high channel mobility can be realized, and therefore the high performance semiconductor device can be provided.

The present embodiment can be applied to a transistor using the polycrystalline semiconductor film 112 made of intrinsic semiconductor as a channel, and a transistor using the polycrystalline semiconductor film 112 made of extrinsic semiconductor as a channel.

Hereafter, second and third embodiments which are modifications of the first embodiment will be described focusing on differences from the first embodiment.

Second Embodiment

Figure 8:
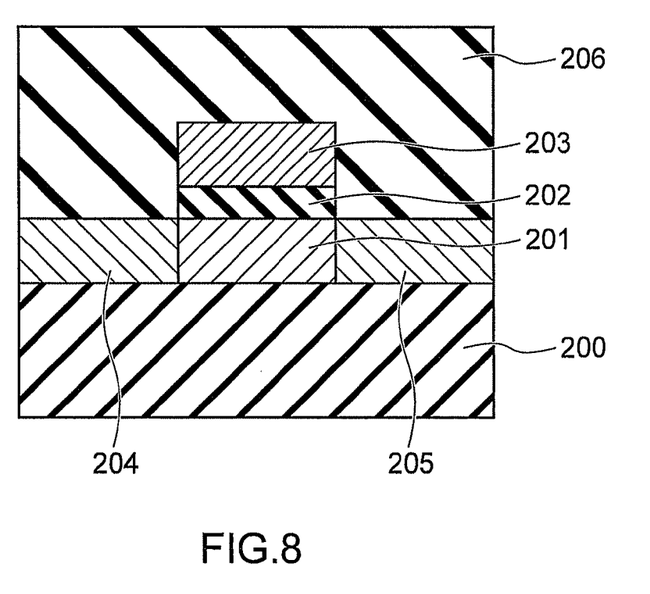
FIG. 8 is a side sectional view showing a structure of a semiconductor device of a second embodiment.

FIG. 8 is a side sectional view showing a structure of a semiconductor device of the second embodiment. The device of FIG. 8 includes a thin film transistor (TFT) for driving a liquid crystal display.

The device of FIG. 8 includes, as elements of the TFT, a glass substrate 200, a polycrystalline SiGe film 201 formed on the glass substrate 200, a gate electrode 203 formed on the polycrystalline SiGe film 201 via a gate insulator 202, and source and drain regions 204 and 205 formed in the polycrystalline SiGe film 201 so as to sandwich the gate electrode 203. The polycrystalline SiGe film 201 is an example of the polycrystalline semiconductor film of the disclosure, and functions as the channel of the TFT.

In the present embodiment, the source and drain regions 204 and 205 in the polycrystalline SiGe film 201 are formed of extrinsic semiconductor, and the region other than the source and drain regions 204 and 205 in the polycrystalline SiGe film 201 is formed of intrinsic semiconductor.

The device of FIG. 8 further includes an insulator 206 formed on the glass substrate 200 to cover the TFT.

FIGS. 9A to 9D are side sectional views showing a method of manufacturing the semiconductor device of the second embodiment.

Figure 9A:
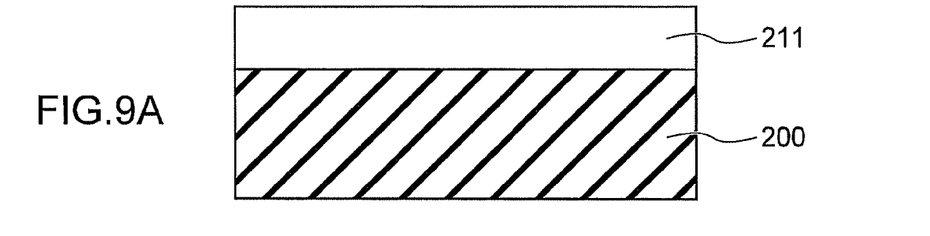
FIGS. 9A to 9D are side sectional views showing a method of manufacturing the semiconductor device of the second embodiment.

First, as shown in FIG. 9A, an amorphous SiGe film 211 having a thickness of 50 to 100 nm is deposited on the entire surface of the glass substrate 200 using a $SiH_4$ gas and a $GeH_4$ gas at 450° C. The amorphous SiGe film 211 is an example of the amorphous semiconductor film of the disclosure.

Figure 9B:
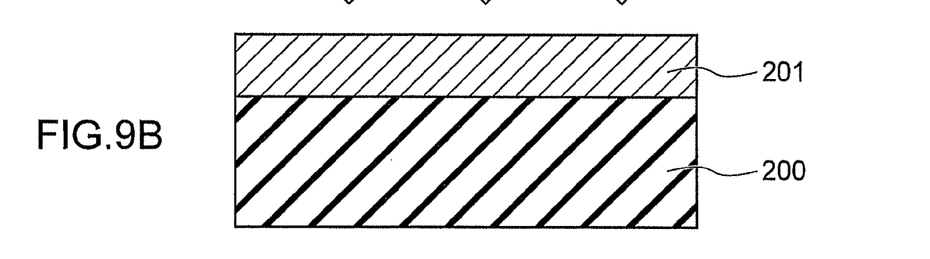

Next, as shown in FIG. 9B, the amorphous SiGe film 211 on the glass substrate 200 is annealed by irradiating the glass substrate 200 with a microwave. In the present embodiment, the glass substrate 200 is irradiated with the microwave of 5.80 GHz at power of 10 $W/cm^2$ to 10 $kW/cm^2$. Due to the irradiation of the microwave, the amorphous SiGe film 211 is heated and the glass substrate 200 is then warmed by thermal conduction, so that the substrate temperature is increased to a temperature between 450° C. and 550° C. At this temperature, the microwave annealing is performed for 15 minutes to two hours. The amorphous SiGe film 211 is changed into the polycrystalline SiGe film 201 by the annealing.

Figure 9C:
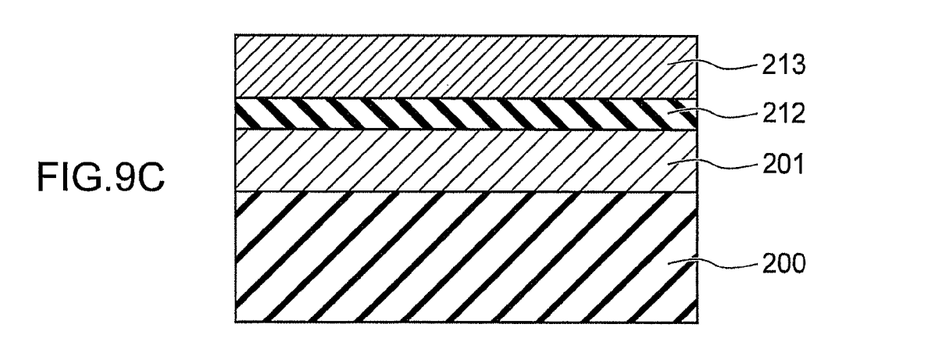

Next, as shown in FIG. 9C, a gate insulator material 212 as a material of the gate insulator 202 and a gate electrode material 213 as a material of the gate electrode 203 are successively formed on the polycrystalline SiGe film 201.

Figure 9D:
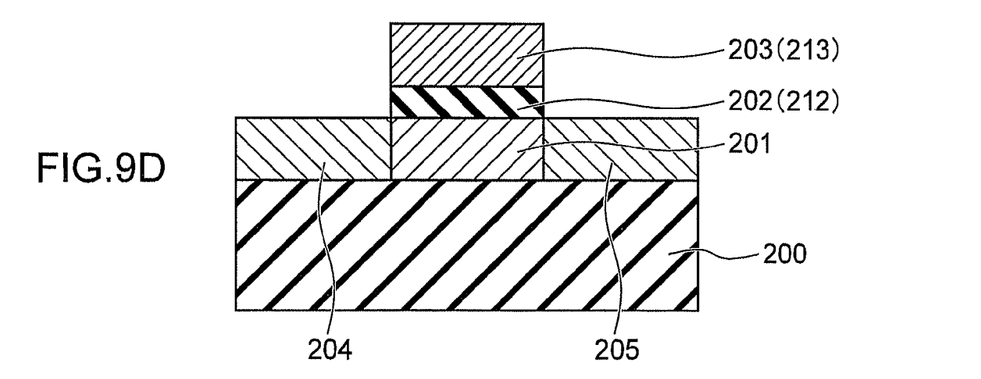

Then, as shown in FIG. 9D, the gate electrode material 213 is etched to form the gate electrode 203 and the gate insulator 202 with the gate electrode material 213 and the gate insulator material 212, respectively. As shown in FIG. 9D, the source and drain regions 204 and 205 are then formed in the polycrystalline SiGe film 201 so as to sandwich the gate electrode 203. As a result, a TFT whose channel is the polycrystalline SiGe film 201 is formed.

The insulator 206 covering the TFT and the like is then formed. In this way, the semiconductor device shown in FIG. 8 is manufactured.

When the present inventors carried out the method shown in FIGS. 9A to 9D, the diameters of the SiGe crystal grains forming the polycrystalline SiGe film 201 became 200 nm to 1 μm. On the other hand, the diameters of the SiGe crystal grains obtained by the furnace annealing were about 50 nm to 100 nm. It was understood that the crystal grains having large diameters can be formed according to the present embodiment.

Effects of the second embodiment will now be described.

As described above, in the present embodiment, the polycrystalline semiconductor film 201 is formed from the amorphous semiconductor film 211 by the microwave annealing, and a transistor (TFT) whose channel is the polycrystalline semiconductor film 201 is formed, similarly to the first embodiment. This makes it possible to crystallize the amorphous semiconductor film 211 at lower temperature and shorter time as compared with the furnace annealing and the lamp annealing. As a result, in the present embodiment, the semiconductor device can be manufactured at lower cost, and crystal grains having large diameters can be formed. Therefore, in the present embodiment, a channel having high channel mobility can be realized, and therefore the high performance semiconductor device can be provided.

The present embodiment can be applied to a transistor using the polycrystalline semiconductor film 201 made of intrinsic semiconductor as a channel, and a transistor using the polycrystalline semiconductor film 201 made of extrinsic semiconductor as a channel.

Third Embodiment

In a third embodiment, first annealing and subsequent second annealing are performed as the microwave annealing of FIG. 3B. The second annealing is performed at the substrate temperature lower than that of the first annealing at the same microwave power.

In the first annealing, the semiconductor substrate 100 is irradiated with the microwave of 5.80 GHz at power of 10 $W/cm^2$ to 10 $kW/cm^2$. The substrate temperature is increased to a temperature between 550° C. and 800° C. (for example, between 600° C. and 650° C.) by the irradiation of the microwave. At this temperature, the microwave annealing is performed for one minute to five minutes. The temperature is an example of first substrate temperature.

Next, in the second annealing, in a manner similar to the first annealing, the semiconductor substrate 100 is irradiated with the microwave of 5.80 GHz at power of 10 $W/cm^2$ to 10 $kW/cm^2$. In the second annealing, the substrate temperature is decreased into 300° C. to 550° C., and the microwave annealing is performed for ten to thirty minutes at this temperature. As a result, the polycrystalline Si film 112 is formed from the amorphous Si film 121. The temperature is an example of second substrate temperature.

Examples of a method of decreasing the substrate temperature include three methods shown in FIGS. 10A to 10D. FIGS. 10A to 10D are diagrams for explaining the methods of decreasing the substrate temperature in the third embodiment. In FIGS. 10A to 10D, a wafer (semiconductor substrate) is shown by reference numeral 300.

Figure 10A:
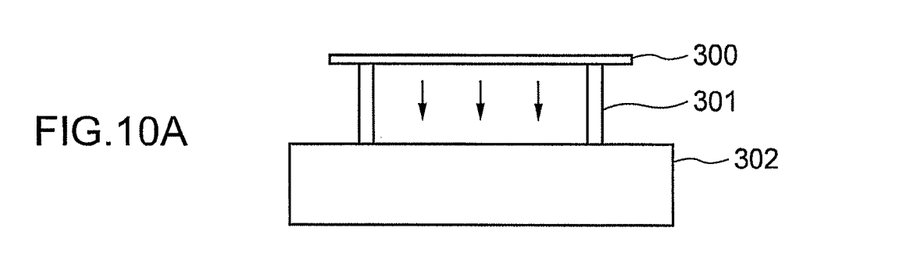
FIGS. 10A to 10D are diagrams for explaining methods of decreasing a substrate temperature in a third embodiment.
Figure 10B:
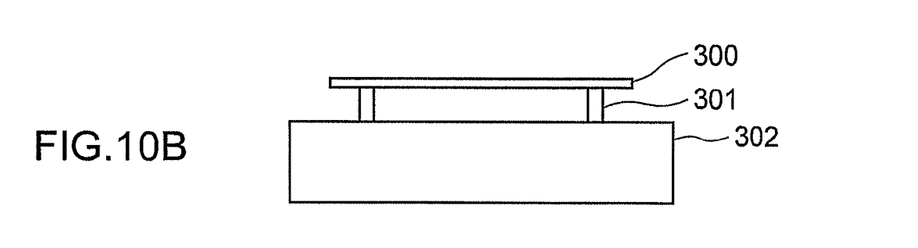
Figure 10C:
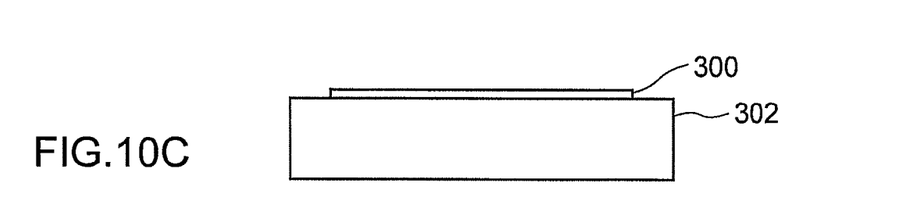
Figure 10D:
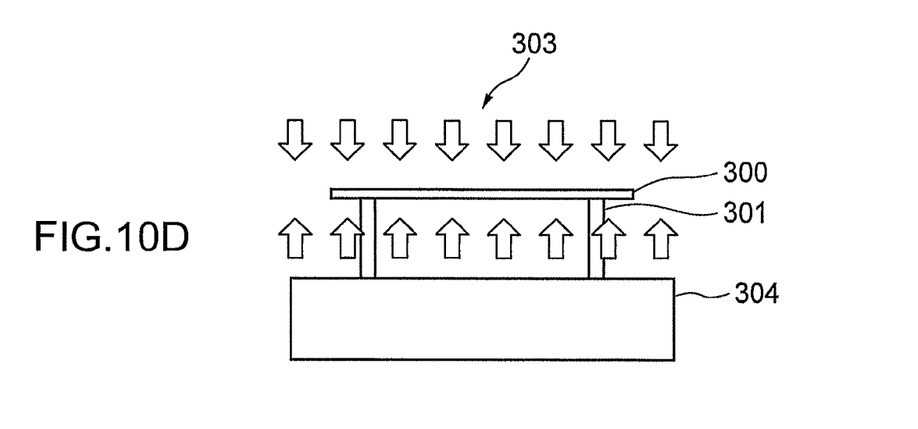

FIGS. 10A and 10B show a method in which the wafer 300 supported by a plurality of pins 301 is made to approach a quartz susceptor 302. FIG. 10C shows a method of directly mounting the wafer 300 on the quartz susceptor 302. FIG. 10D shows a method of spraying a coolant gas (for example, He gas) 303 to the wafer 300. A susceptor 304 in FIG. 10D may be a susceptor other than the quartz susceptor 302. Other examples of the coolant gas 303 include an $N_2$ gas, a Ne gas, an Ar gas, and a Xe gas.

When the present inventors carried out the method of the third embodiment, the diameters of the Si crystal grains forming the polycrystalline Si film 112 had values between 50 and 300 nm. It was understood that the crystal grains having diameters larger than those obtained by the method of the first embodiment can be formed by the method of the third embodiment.

(1) Details of First Annealing and Second Annealing

The details of the first annealing and the second annealing will now be described.

As described in the first embodiment, in the case of annealing the amorphous Si film on the $SiO_2$ film, no crystal nucleus is generated at the substrate temperature lower than 550° C. Therefore, in the third embodiment, a crystal nucleus is generated during the first annealing but is not generated during the second annealing. Therefore, in the third embodiment, as it is understood from the mechanism described with reference to FIGS. 6A to 6D, a crystal grain having a diameter larger than that in the case of the first embodiment can be formed. In the third embodiment, the switching from the first annealing to the second annealing can suppress the generation of the crystal nuclei after the switching.

Therefore, it is preferable to carry out the first annealing at a temperature equal to or higher than the lowest generation temperature of the crystal nucleus (550° C.) only for time in which the crystal nuclei of the necessary number are generated. When the time is too long, the crystal nuclei more than the necessary number are generated, and the diameter of each crystal grain becomes small. On the other hand, when the time is too short, crystallization stops before the amorphous Si film 121 completely changes into the polycrystalline Si film 112. In the present embodiment, the generation of the crystal nuclei more than the necessary number is avoided by setting the time of carrying out the first annealing to one minute to five minutes.

It is preferable to carry out the second annealing at a temperature equal to or lower than the lowest generation temperature of the crystal nucleus (550° C.) only for time necessary for the amorphous Si film 121 to completely change into the polycrystalline Si film 112. In the second annealing, generation of new crystal nuclei is suppressed, and the crystal growth of the crystal nuclei generated in the first annealing progresses. In the present embodiment, the second annealing is executed for ten to thirty minutes. As described above, in the present embodiment, the second annealing is performed for longer time than the first annealing.

Although the Si film is used as the amorphous semiconductor film 121 in the present embodiment, a SiGe film may be used instead of the Si film. The lowest generation temperature of the crystal nucleus in the amorphous SiGe film decreases as the Ge composition ratio increases. Therefore, in the case of using the amorphous SiGe film, the first annealing can be performed at the substrate temperature of 600° C. or less (in the present embodiment, 550° C. or less).

For example, in the case where the Ge composition ratio is 0.7 to 0.9 and the thickness is 10 nm, the lowest generation temperature of the crystal nucleus is about 400° C. Therefore, in this case, the first annealing is performed at the substrate temperature of 400° C. to 550° C. for ten minutes, and the second annealing is performed at the substrate temperature of 350° C. to 400° C. for one to two hours, for example. In this way, crystal grains having diameters larger than those in the case of the first embodiment can be formed. The optimum substrate temperature depends on not only the Ge composition ratio but also the thickness of the amorphous SiGe film.

In the case of using the SiGe film as the amorphous semiconductor film 121, the Ge composition ratio X may be any value satisfying the relation 0<X<1. The amorphous semiconductor film 121 may be also a Ge film.

The method of the third embodiment can be applied not only to the BiCS flash memory in the first embodiment but also to the TFT of the second embodiment.

(2) Effects of Third Embodiment

Effects of the third embodiment will now be described.

As described above, in the present embodiment, the first annealing and the subsequent second annealing are performed as the microwave annealing. The second annealing is performed at the substrate temperature lower than that in the first annealing. In this way, a crystal grain having a diameter larger than that in the cases of the first and second embodiments can be formed.

While certain embodiments have been described, these embodiments have been presented by way of example only, and are not intended to limit the scope of the inventions. Indeed, the novel devices and methods described herein may be embodied in a variety of other forms; furthermore, various omissions, substitutions and changes in the form of the devices and methods described herein may be made without departing from the spirit of the inventions. The accompanying claims and their equivalents are intended to cover such forms or modifications as would fall within the scope and spirit of the inventions.

The invention claimed is:

1. A method of manufacturing a semiconductor device, the method comprising:
    forming an amorphous semiconductor film on a substrate;
    annealing the amorphous semiconductor film by irradiating the substrate with a microwave to form a polycrystalline semiconductor film from the amorphous semiconductor film, the annealing including a first annealing performed at a first substrate temperature, and a second annealing performed at a second substrate temperature lower than the first substrate temperature after the first annealing;
    cooling the substrate between the first annealing and the second annealing to decrease a temperature of the substrate from the first substrate temperature to the second substrate temperature; and
    forming a transistor whose channel is the polycrystalline semiconductor film.

2. The method of claim 1, wherein
    the amorphous semiconductor film is an amorphous silicon film,
    the first substrate temperature is higher than 550° C. and lower than or equal to 800° C., and
    the second substrate temperature is higher than or equal to 300° C. and lower than 550° C.

3. The method of claim 1, wherein
    the amorphous semiconductor film is an amorphous silicon germanium film,
    the first substrate temperature is higher than 400° C. and lower than or equal to 550° C., and
    the second substrate temperature is higher than or equal to 200° C. and lower than 400° C.

4. The method of claim 1, wherein the second annealing is performed for longer time than the first annealing.

5. The method of claim 1, wherein the cooling of the substrate is performed with a gas or a susceptor between the first annealing and the second annealing.

6. The method of claim 1, wherein the polycrystalline semiconductor film contains a crystal grain having a diameter equal to or larger than twice a thickness of the polycrystalline semiconductor film.

7. The method of claim 1, wherein a frequency of the microwave is 2.45 to 25.0 GHz.

8. The method of claim 1, wherein the transistor is formed by:
   forming a structure in which insulating films and semiconductor films are alternately stacked on the substrate, and a memory hole is opened in the insulating films and the semiconductor films;
   successively forming a memory insulating film and the amorphous semiconductor film on an inner wall surface of the memory hole; and
   forming the polycrystalline semiconductor film from the amorphous semiconductor film by the annealing.

9. The method of claim 1, wherein a thickness of the amorphous semiconductor film is 10 nm or less.

10. The method of claim 9, wherein the polycrystalline semiconductor film contains a crystal grain having a diameter of 30 to 250 nm.

11. The method of claim 9, wherein the polycrystalline semiconductor film contains a crystal grain having a diameter of 50 to 300 nm.

12. The method of claim 1, wherein the transistor is formed by:
   forming the amorphous semiconductor film on the substrate;
   forming the polycrystalline semiconductor film from the amorphous semiconductor film by the annealing;
   forming a gate electrode on the polycrystalline semiconductor film via a gate insulator; and
   forming source and drain regions in the polycrystalline semiconductor film so as to sandwich the gate electrode.

13. The method of claim 1, wherein a thickness of the amorphous semiconductor film is 50 to 100 nm.

14. The method of claim 13, wherein the polycrystalline semiconductor film contains a crystal grain having a diameter of 200 nm to 1 μm.

* * * * *